(12) United States Patent
Doherty (10) Patent No.: US 6,625,430 B2
(45) Date of Patent: Sep. 23, 2003

(54) METHOD AND APPARATUS FOR ATTAINING HIGHER AMPLIFIER EFFICIENCIES AT LOWER POWER LEVELS

(75) Inventor: Peter J. Doherty, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/971,480

(22) Filed: Oct. 5, 2001

(65) Prior Publication Data

US 2002/0019219 A1 Feb. 14, 2002

Related U.S. Application Data

(62) Division of application No. 09/211,638, filed on Dec. 15, 1998.

(51) Int. Cl.[7] ................................................. H04B 1/04
(52) U.S. Cl. .......................... 455/126; 455/115; 330/51
(58) Field of Search ................................... 455/115, 126, 455/127; 330/51, 124 R; 375/295, 297

(56) References Cited

U.S. PATENT DOCUMENTS 5,548,246 A * 8/1996 Yamamoto et al. ............ 330/51
5,872,481 A * 2/1999 Sevic et al. .................... 330/51

* cited by examiner

*Primary Examiner*—Lee Nguyen
(74) *Attorney, Agent, or Firm*—Coats & Bennett, P.L.L.C.

(57) ABSTRACT

The present invention relates to a method and apparatus for providing a radio frequency output to promote higher amplifier efficiencies. In one embodiment, the apparatus includes a driver and a switch that alternately connects first and second circuit paths to the driver and an antenna. A power amplifier having a first bias lead lies in the second circuit path. When low power is required, the switch connects the first circuit path to the antenna, and disconnects the first bias lead from a bias. When high power is required, the switch disconnects the first circuit path from the antenna, and connects the second circuit path and the first bias lead to the antenna and the bias, respectively.

6 Claims, 10 Drawing Sheets

HIGH POWER OPERATING MODE

LINEAR OPERATING MODE

FIG. 10

SATURATED OPERATING MODE

METHOD AND APPARATUS FOR ATTAINING HIGHER AMPLIFIER EFFICIENCIES AT LOWER POWER LEVELS

The following application is a divisional of application Ser. No. 09/211,638 filed Dec. 15, 1998.

BACKGROUND OF THE INVENTION

1. Technical Field

The present invention relates to radio telecommunications, and more particularly to an apparatus and method for improving the efficiency of amplifiers used in mobile radio telephones.

2. Background Art

Wireless cellular telecommunications systems typically utilize radio frequency signals to exchange information between fixed base stations and free-standing mobile radio telephones. Each base station transmits and receives modulated signals to and from the telephones within a given geographic area through a base station antenna. The base station antenna operates over a fixed-area range called a "cell." In order to provide service to mobile radio telephones over a larger geographic area, several cells are positioned over the area to provide complete coverage.

In typical cellular configurations, base station antennae produce signals that propagate outward 360 degrees from the antenna. When a mobile radio telephone is transmitting radio frequency signals to a base station antenna, the strength of the transmitted signal must be strong enough to be received by the base station antenna even when the mobile radio telephone is located at the most distant fringes of the cell.

Most mobile radio telephones utilize a driver stage which incorporates driver amplifier components. In order to ensure the strength of the transmission signal at distant points within larger cells, some mobile radio telephones utilize a separate power amplifier in the output stage of the telephone circuitry to boost power to the modulated signal delivered from the driver stage. When the mobile radio telephones are located close to the base station antenna near the center of a cell, however, a stronger transmission signal is not needed. Boosting transmission signals in such situations where high power transmission is not necessary wastes valuable battery power within a mobile radio telephone. The net result of such inefficient power consumption and poor transmitter efficiency is a reduced amount of talk time for the user.

In the past, the radio frequency drive level to the driver stage was lowered when less than full power was required from the power amplifier. This would cause the efficiency of the power amplifier to decrease significantly. Furthermore, because the output transistors of the power amplifier are sized for optimum efficiency at full power output, considerable current could be wasted in the power amplifier when during operation at lower power levels. In some prior art mobile radio telephones, bias to the power amplifier would be switched to a lower idling current when a low output power was required. At such low output levels, the driver amplifier within the driver stage would itself be capable of exciting the telephone antenna to effectively transmit radio signals. Thus, if the power requested from the power amplifier was low enough, the driver stage itself would consume enough DC power to supply the required transmission power directly to the antenna, and the power amplifier would be a redundant drain on valuable current.

Compounding the above problems relating to transmission power, transmitter efficiency can also suffer when the mobile power amplifier is switched between a linear mode and a saturated mode. Conventional analog cellular telephones transmit voice information via a frequency modulation technique, in which an information signal is encoded into a carrier radio signal. In order to efficiently amplify a frequency modulated signal for transmission to a base station, amplifiers within the telephone circuitry are typically operated in a saturation mode to maximize transmission power. Digital cellular telephones and networks, however, transmit digitally modulated information signals in a linear mode. These signals are modulated using a composite modulation technique in which encoded information is carried by both an amplitude modulation and phase variation of the signal. In order to preserve the waveform shape and the integrity of the modulated information during transmission, amplifiers must be operated in a linear mode.

Digital cellular networks and subscriber services are not as widely available as analog networks in many geographical areas. A user, therefore, will often be forced to use a digital-ready mobile telephone within an analog-only network. In order for a digital mobile radio telephone to be usable within both digital and analog cellular networks, prior art mobile telephones have incorporated switchable amplifier stages to allow the mode of transmission to change between a saturated and a linear mode to accommodate either analog and digital transmissions, respectively.

An example of such a system is shown in U.S. Pat. No. 5,060,294. In this prior art system, the information signal modulation is detected and signal amplifier circuitry is accordingly operated in either a saturation mode or linear mode. This system has drawbacks, however, because the driver stage, the output stage and an impedance matching network implemented in the circuitry are switched together between the saturation mode or linear mode. Because the driver stage must be shifted into each operating mode along with the output stage, the driver stage is not utilized in an efficient manner, and power consumption within the mobile radio telephone can again suffer.

Therefore, there is a need for an improved method and apparatus for modifying the mode of transmission and for varying the signal power output of mobile radio telephones to use system power more efficiently.

SUMMARY OF THE INVENTION

To address these problems and shortcomings in the prior art, an apparatus is provided herein for supplying a radio frequency output to promote higher amplifier efficiencies. The apparatus includes driver means having a driver output for providing an amplified radio frequency signal and switching means in communication with the driver output of the driver means. The switching means directs the amplified radio frequency signal to one of at least a first and a second circuit paths connectable to the output of the driver means. The first circuit path provides a low power level output of the radio frequency signal, and the second circuit path provides a high power level output of the radio frequency signal. In the low power level mode, the power amplifier in the output stage is switched out of the circuit path.

The invention may be further embodied in an apparatus for delivering a radio frequency signal. The apparatus comprises a driver stage having an input receiving a radio frequency signal and an output providing a first amplified radio frequency signal. A switching device is included and is in communication with the driver stage. An output stage is provided and is in communication with the switching device. At least one bypass circuit path in communication with the switching device is included to bypass the output stage and provide the first amplified radio frequency signal directly to the antenna. The switching device is operable to direct the first amplified radio frequency signal from the driver stage to the output stage or the bypass circuit path.

The invention may also be embodied in a method for efficiently amplifying a modulated radio frequency signal in a radio telephone. The method includes the steps of supplying a modulated signal from a driver stage having at least one radio frequency amplifier, determining the transmission power requirements of the modulated signal, selecting one of a plurality of output stages in accordance with the transmission power requirements, switching the modulated signal to the selected output stage, and supplying the output of the selected output stage to an antenna.

The invention may be further embodied in a method for amplifying a modulated radio frequency signal modulated using at least one of a plurality of modulation techniques. The method includes the steps of supplying a modulated signal from a driver stage, determining the modulation technique of the modulated signal, selecting one of a plurality of output stages based on the modulation technique, and supplying the output of the selected output stage to an antenna. The first of the output stages includes at least one power amplifier for use with a composite modulated signal, and at least a second of the output stages does not include a power amplifier. The second output stage is used with frequency modulated signals.

It is to be understood that both the foregoing general description and the following detailed description are exemplary and explanatory and are intended to provide further explanation of the invention as claimed. The invention, together with further objects and attendant advantages, will best be understood by reference to the following detailed description, taken in conjunction with the accompanying drawings.

DETAILED DESCRIPTION OF PRESENTLY PREFERRED EXEMPLARY EMBODIMENTS

Figure 1:
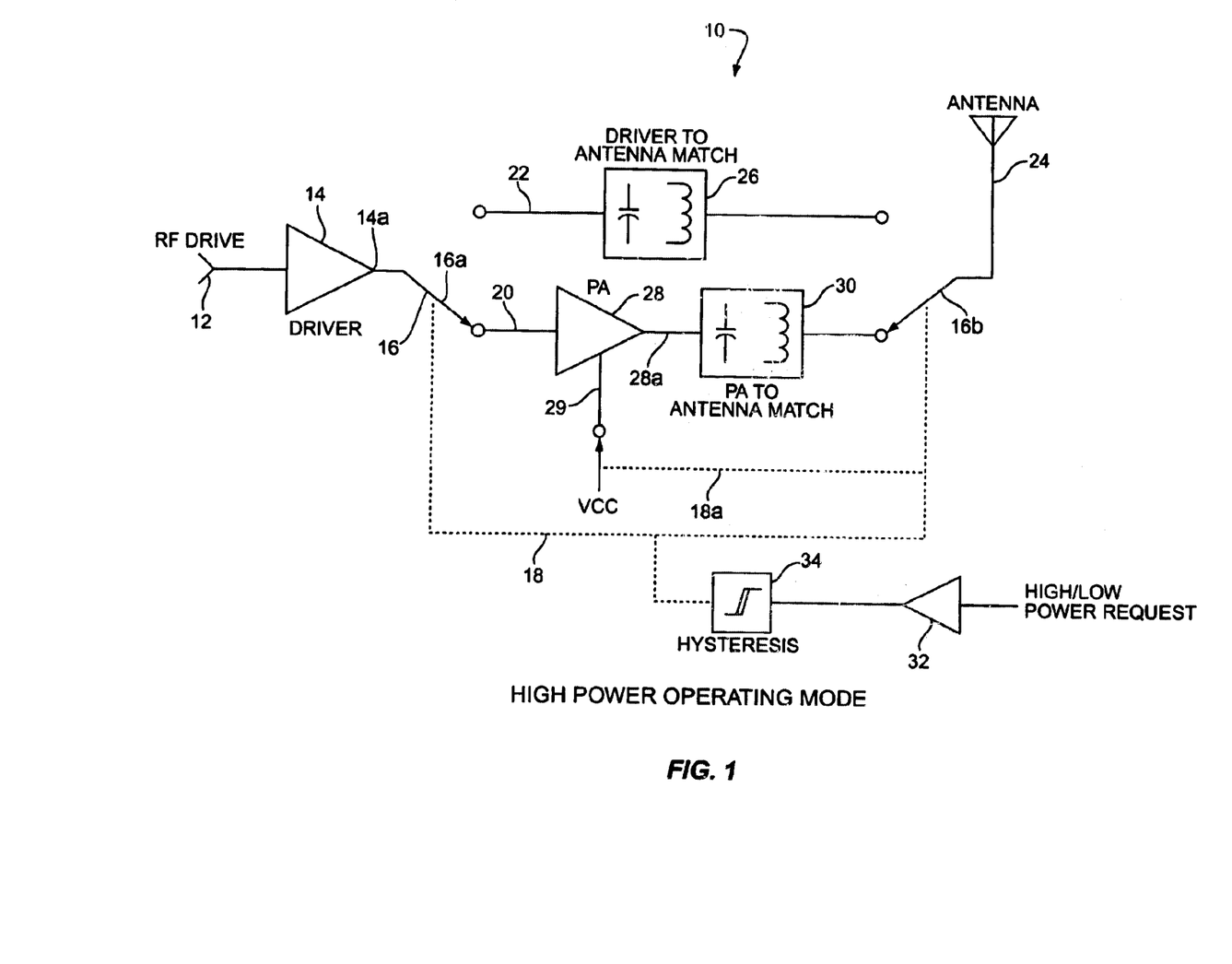
FIG. 1 is a schematic diagram of a first preferred embodiment of the apparatus embodying the present invention in a high power operating mode.
Figure 2:
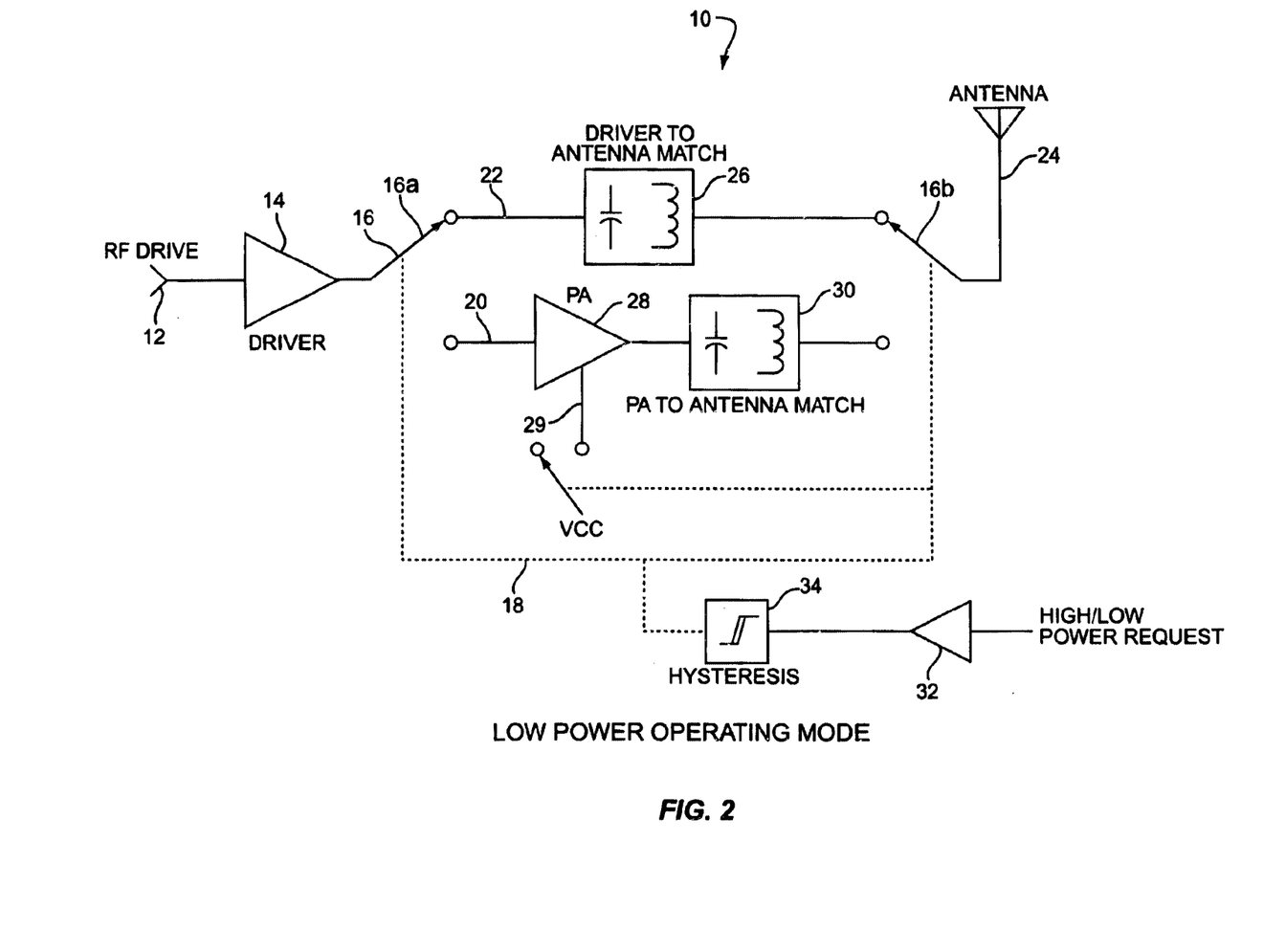
FIG. 2 is a schematic diagram of a first preferred embodiment as shown in FIG. 1 in a low power operating mode.

In a first preferred embodiment, the principal components of a radio frequency transmission system 10 within a mobile radio telephone are shown in FIG. 1 operating in a high power transmission mode. FIG. 2 shows the system 10 operating in a low power transmission mode. With reference first to FIG. 1, the system 10 preferably includes a plurality of cascading amplifier stages. As shown in the Figure, the output 12 of the radio frequency drive (not shown) is linked to a driver amplifier 14. Preferably, the driver is a biased class A amplifier, which is well-known in the art.

The output 14a of amplifier 14 is linked to a switching means 16, which preferably includes a pair of throw means 16a and 16b. The throw means 16a and 16b are preferably synchronized via a cross-link 18. The switching means 16 switches the output 14a of the driver amplifier 14 between two output stages 20 and 22 via the throw means 16a. Each output stage 20 and 22 preferably comprises a load line incorporating circuitry and components to process the output 14a of the driver 14. Throw means 16b, working in conjunction with the throw means 16a, routes the output of the selected output stage 20 or 22 to an antenna 24. In the preferred embodiment, the switching means 16 comprises solid-state switching control logic in communication with various other circuit components. Alternatively, one skilled in the art will appreciate that a variety of switching devices may be used, such as single-pole, double-throw mechanical switches, relays, and the like.

The first output stage 22 shown in the system 10 does not include an amplifier stage, but rather directs the driver output signal directly to the antenna 24 via the switching throw means 16b. If the impedance of the antenna 24 does not match the transmission signal, a matching network 26 may be provided to adapt the signal to the antenna 24. Preferably, the matching network 26 incorporates capacitors and winding elements arranged to provide an impedance match between the driven signal and the impedance of the antenna.

The second output stage 20 includes an output amplifier stage including a conventional power amplifier 28 receiving the radio frequency signal from the output 14a of the driver amplifier 14 via the throw means 16a. The power amplifier 28 is preferably running class AB and is biased via lead 29. The output 28a of the power amplifier 28 is linked to a second matching network 30, which is in turn linked via throw means 16b to the antenna 24. The matching network 30 provides an impedance match between the signal output of the amplifier 28 and the impedance of the antenna 24.

The switching means 16 therefore allows the system 10 to switch between one of two output stages 22 and 20 to accommodate changes in the transmission power requirements of the system. Requests for transmission power changes are preferably received from a power request means 32 in communication with the switching means 16 via the cross-link 18. The power request means 32 can comprise, for example, a manual keyed switch or a detector for reading received requests from the system or from a cellular base station. In the latter option, the cellular base station may signal a particular mobile unit that the transmission signal strength will need to be increased due to a weak received signal at the base station. Alternatively, a comparator for evaluating the signal strength at the radio frequency drive output 12 can read signal strength requests or compare received signals with a preset threshold to determine whether a high or low power request is necessary.

In the preferred embodiment, the request means 32 operates the switching means 16 upon determining that a high or low power request is required. When high power is required to transmit the radio frequency signal to a base station, the configuration shown in FIG. 1 is utilized, wherein the switching means 16 directs the driver output signal to the second output stage 20. In this configuration, the request means 32 also directs the switching means 16 to allow bias power to the lead 29 of the power amplifier 28. When low power is required, the configuration shown in FIG. 2 is utilized, wherein the switching means 16 directs the driver output signal to the first output stage 22, thereby bypassing the output stage 20 and its power amplifier 28. The output of stage 22 is linked via throw means 16b to the antenna 24. As shown in this configuration, the switching means 16 also disconnects the bias from the power amplifier 28 so that it no longer draws current in this off-line state.

Although only two amplifier stages are shown, the preferred embodiment of the invention shown herein can be implemented in several amplifier stages running in either a linear or saturated mode.

Figure 3:
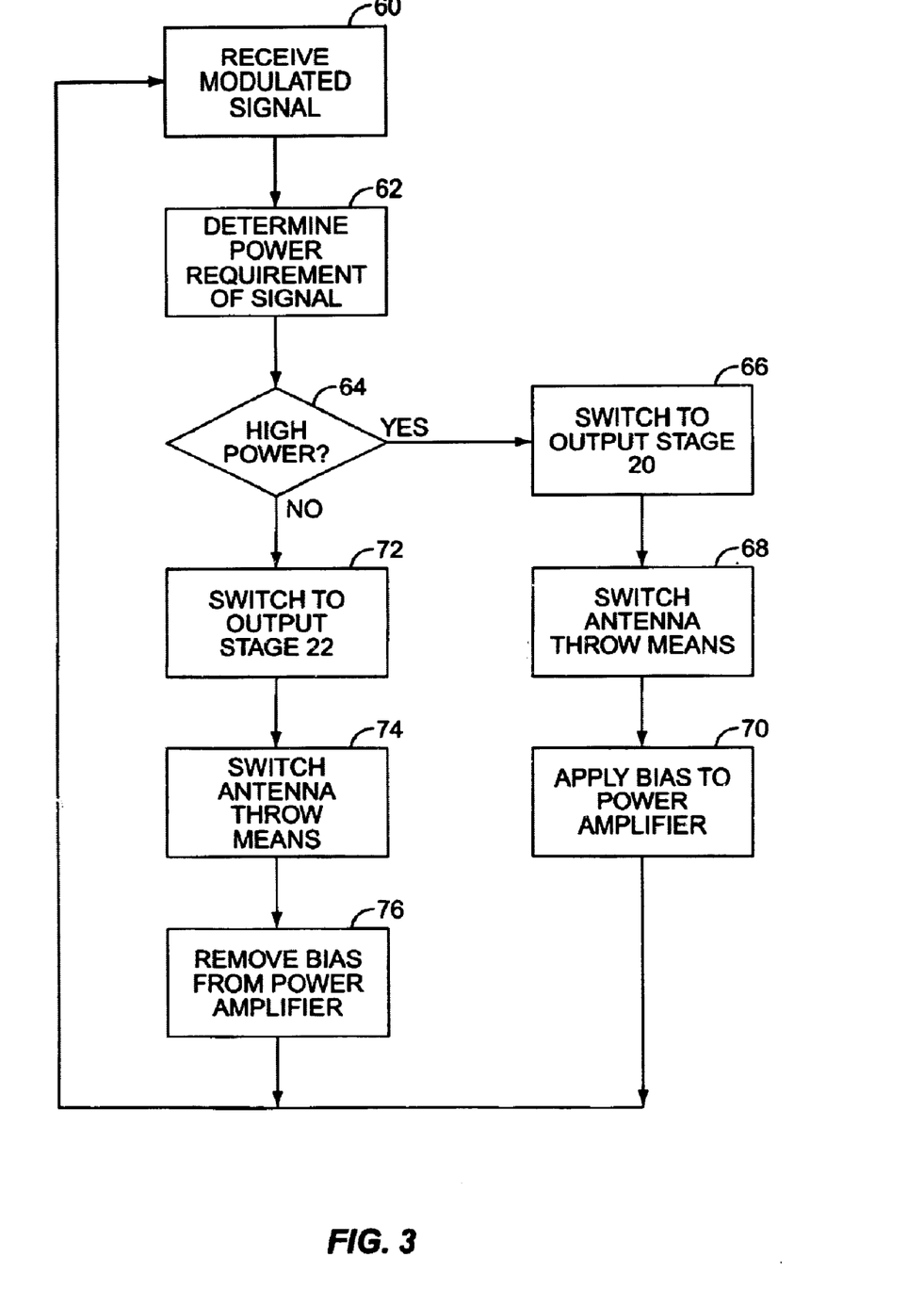
FIG. 3 is a flow diagram showing a preferred embodiment of the method embodying the present invention.

The method utilizing the present invention will now be described in conjunction with FIG. 3, which is a flow diagram showing a preferred embodiment of the method of the present invention using the apparatus described and shown in FIGS. 1 and 2. As shown in box 60 of the diagram, the modulated signal from the radio frequency drive is received at 12. The comparator 32 then determines the power requirements for the signal at 60 and 62, preferably either by a direct reading of the signal, comparing the signal with a threshold, or by reading an incoming signal from the base station to the system 10. If the comparator 32 determines that high power operation is required for proper transmission, the switching means 16 begins the switching operation at 66 to arrive at the configuration shown in FIG. 1. In particular, the throw means 16a switches the driver stage output to the second output stage 20 (box 66), and the throw means 16b switches the output from the power amplifier 28 to the antenna 24 (box 68). The switching means 16, via cross-link 18a, also applies bias to the lead 29 of the power amplifier 28 (box 70).

If the comparator 32 determines that low power is required for transmission, the switching means 16 switches the output of the driver stage to the first output stage 22, as shown in box 72 and FIG. 2. In particular, the throw means 16a switches the output from the driver stage 14 to the first output stage 22, and the throw means 16b switches the output from the output stage 22 to the antenna 24 (box 74). As shown at box 76 and FIG. 2, the bias is removed from the lead 29 so the off-line power amplifier 28 is not drawing current.

The following example illustrates the efficiency benefits achieved by the present embodiment:

In this example, the driver amplifier 14 has an output power of 0 dBm, a DC efficiency of 10%, and consumes 10 miliwatts. The power amplifier 28 is biased for an output power of 30 dBm (with gain=30 dB) and has a DC efficiency of 25%. The DC power consumed by the power amplifier 28 is 4 watts. In the prior art, assuming that both amplifiers were biased class A, when the system proceeds to request a low power output, or 0 dBm output from the power amplifier 28, the radio frequency drive is decreased to the drive stage until the power amplifier output is 0 dBm. Both the driver amplifier 14 and the power amplifier would still be drawing DC power at this requested level, however, even though the RF output requested would be relatively low.

In the present embodiment as shown in FIG. 2, when low power is requested, the power amplifier 28 is switched out of the circuit and the DC power to the amplifier 28 is shut off. Thus, the same power output is achieved at low levels due solely to the power of the driver amplifier 14.

In order to prevent "chattering" between a high and low power request, a hysteresis means 34 is preferably interposed between the request means 32 and the switching means 16. The hysteresis means can comprise a conventional delay processor or threshold detector, of the type well-known in the art. For example, a threshold detector hysteresis means 34 could be implemented to bypass the power amplifier 28 when 0 dBm is required by the system 10 and the signal power is decreasing. When power is increasing, the power amplifier 28 may be switched back into the circuit when 1 dBm is required. Of course, other power levels could be programmed into the means 34.

Figure 4:
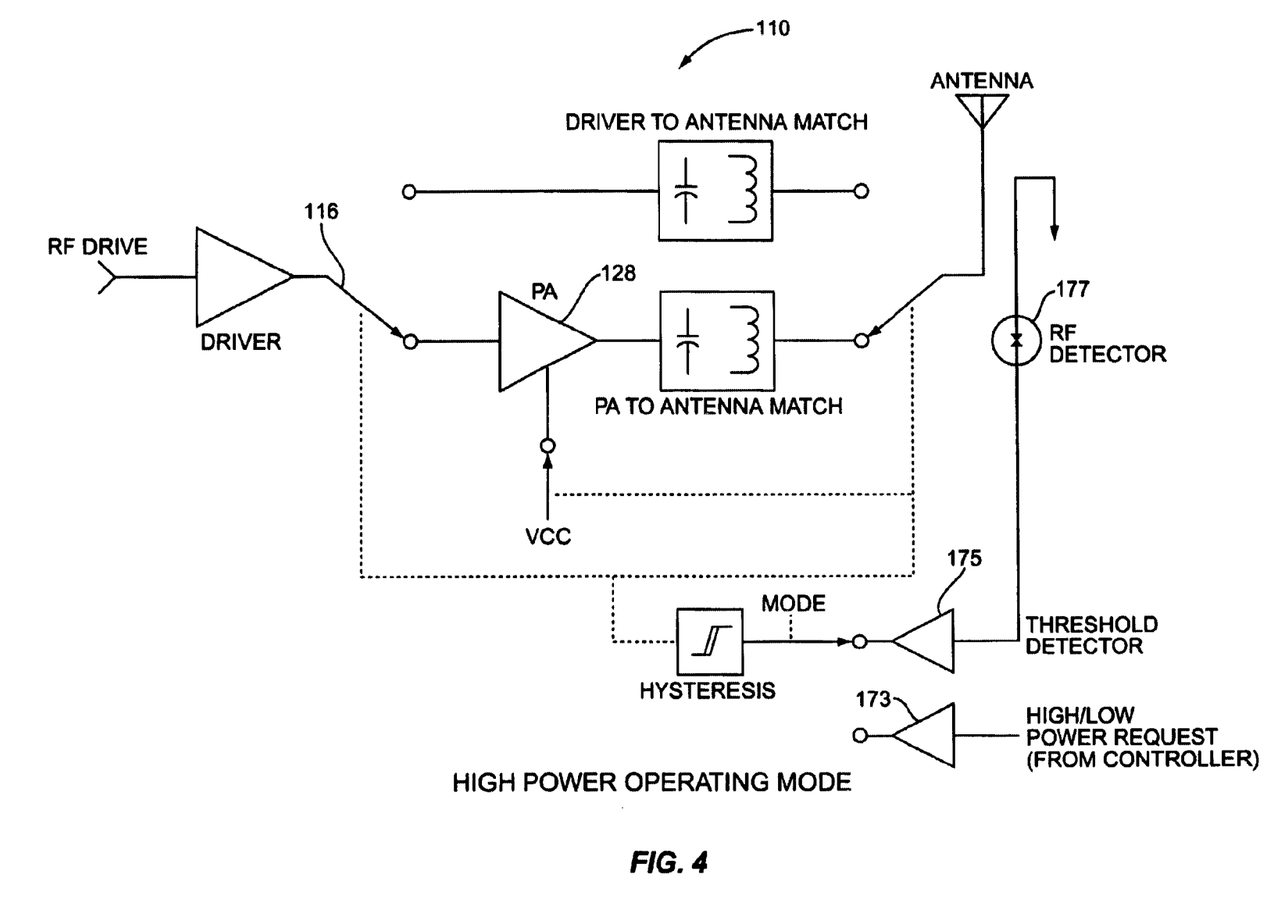
FIG. 4 is a schematic diagram of a second preferred embodiment of the apparatus embodying the present invention in a high power operating mode.

As mentioned above, the request to switch the power amplifier 28 in or out of the circuit can also originate from a radio frequency detector and a threshold detector, as shown in the alternate embodiment in FIG. 4. FIG. 4 shows the identical referenced components illustrated in FIGS. 1–2, with one-hundred digits appended. In this embodiment, a threshold detector 175 can be an operational amplifier analog comparator with a set threshold or a programmable register in a digital comparator. Alternatively, the controller of the mobile radio telephone could switch the power amplifier 128 in or out of the circuit at comparator 173 depending on the signal power level required by the system. In the present embodiment, the threshold detector 175 is linked to the switching means 116 and a signal detector 177.

Figure 5:
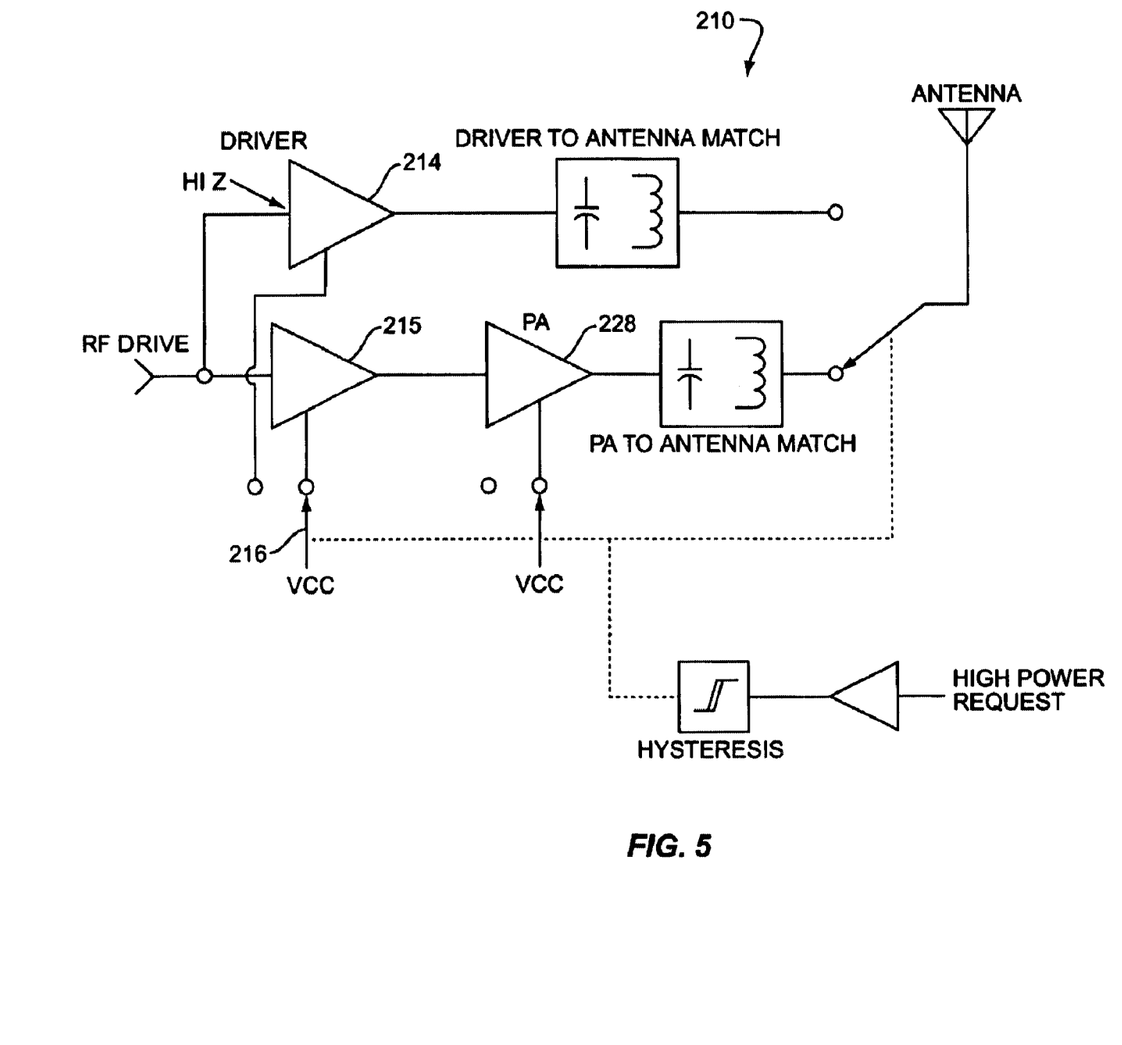
FIG. 5 is a schematic diagram of a third preferred embodiment of the apparatus embodying the present invention in a high power operating mode.
Figure 6:
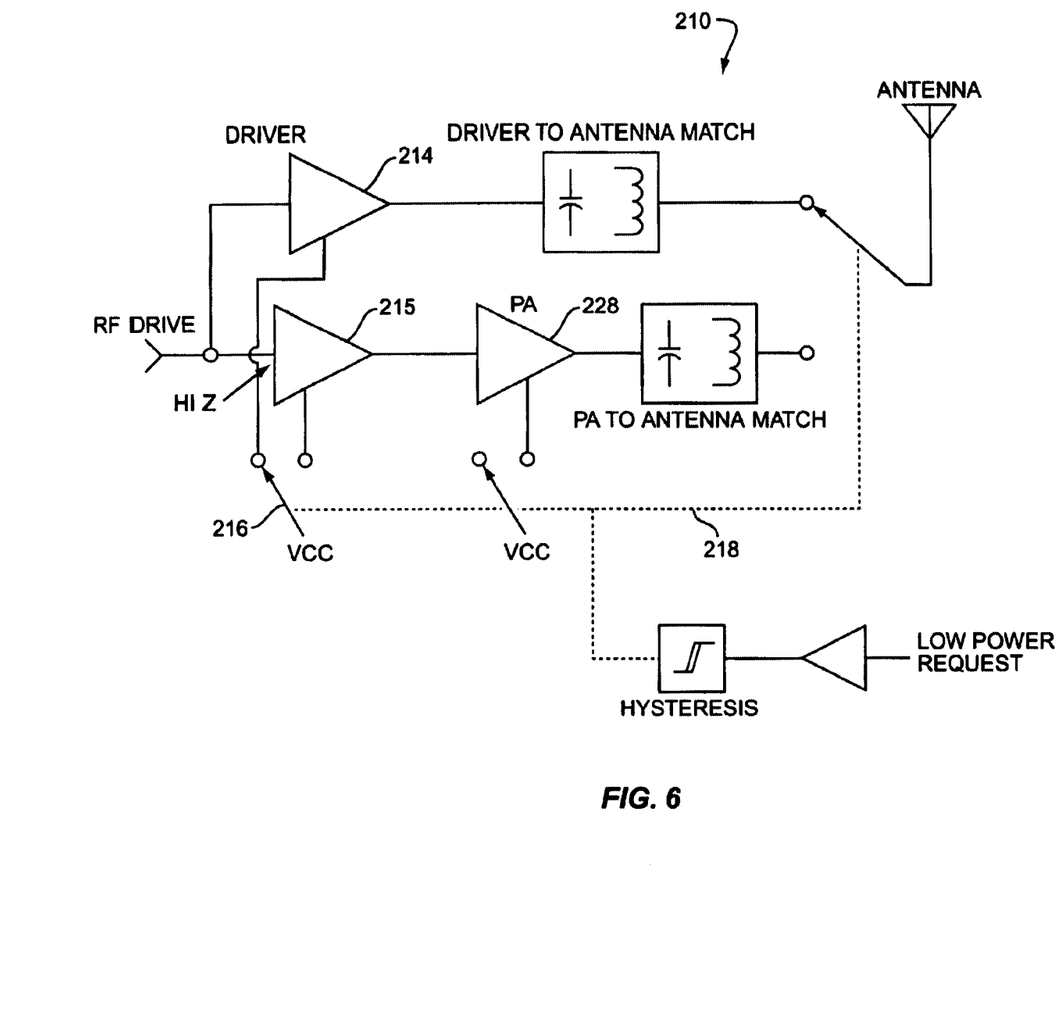
FIG. 6 is a schematic diagram of a third preferred embodiment as shown in FIG. 5 in a low power operating mode.

Various other methods of switching the power amplifier 28 out of the circuit may be utilized without departing from the present invention. For example, as shown in the alternative embodiment of FIGS. 5 and 6, two separate drivers 214 and 215 can be used to simplify the switching implementation. Switching means 216 supplies bias to the appropriate driver and bypasses the power amplifier 228 when the system 210 is operating in the low power mode of FIG. 6.

Figure 7:
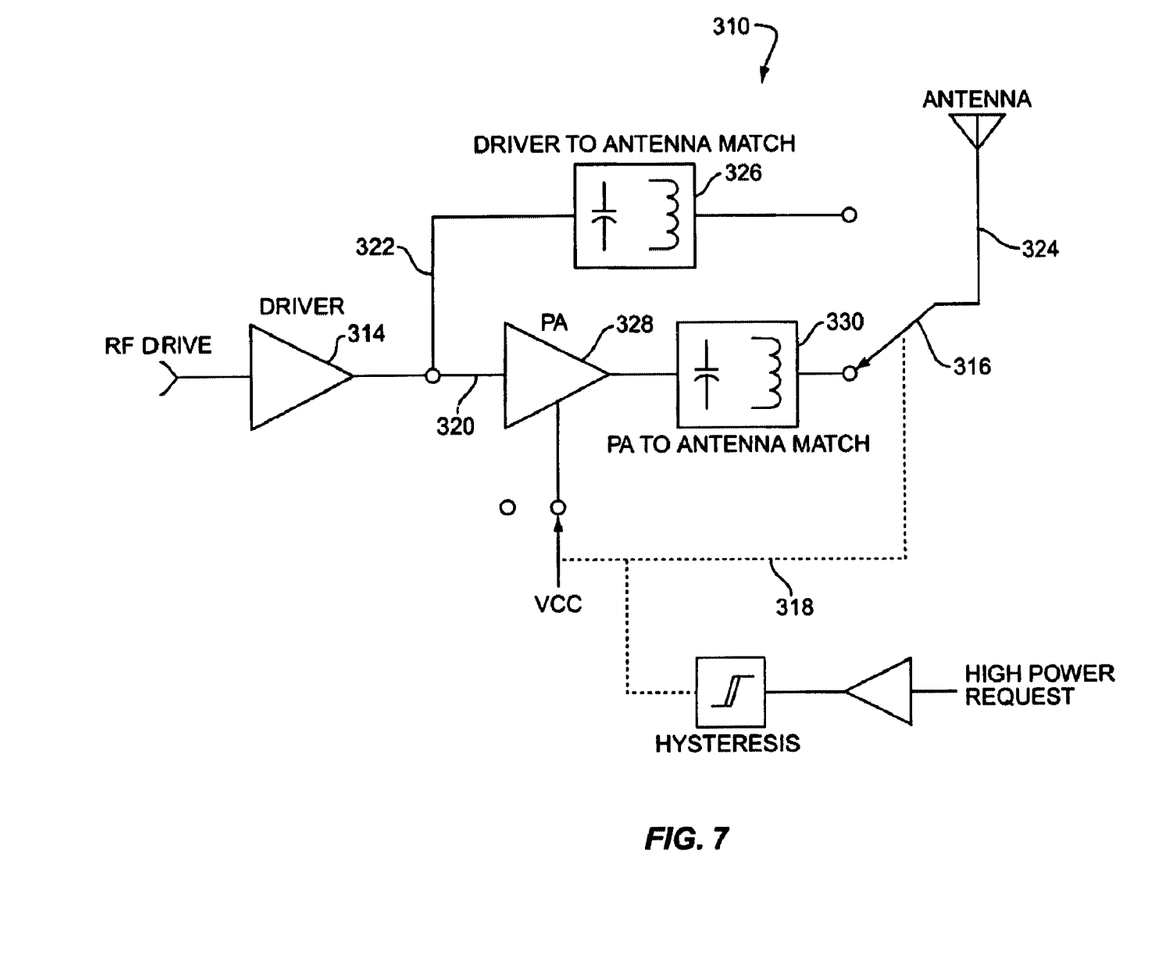
FIG. 7 is a schematic diagram of a fourth preferred embodiment of the apparatus embodying the present invention in a high power operating mode.
Figure 8:
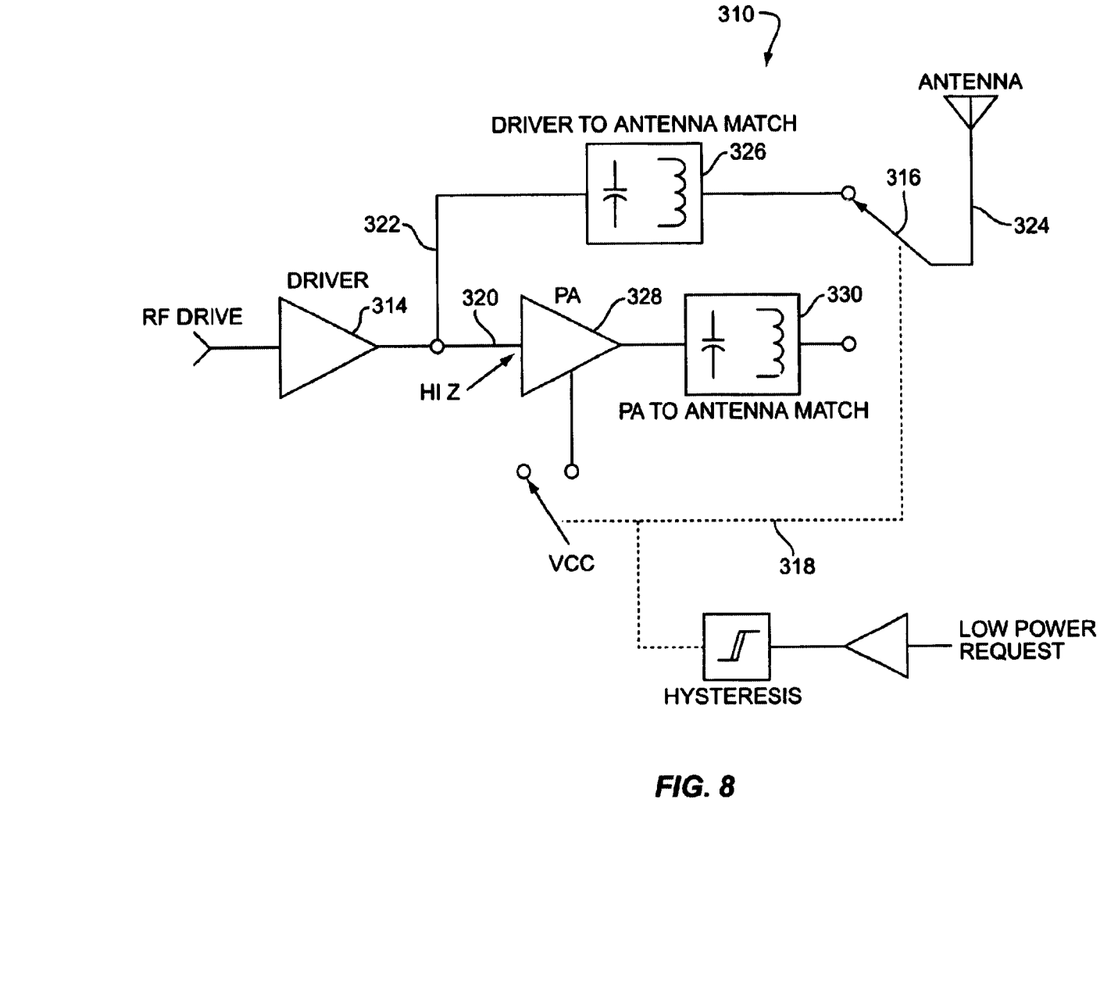
FIG. 8 is a schematic diagram of a third preferred embodiment as shown in FIG. 7 in a low power operating mode.

In another alternate embodiment, the switch between the driver and the power amplifier may be eliminated completely. As shown in FIGS. 7 and 8, the output of the driver 314 to the antenna matching network 326 and the power amplifier 328 and matching network 330 are linked. Switching means 316 can therefore perform the change between high power and low power operation by switching the connection between the antenna 324 and an output stage 320 or 322, and by disconnecting the bias current to the power amplifier 328. FIG. 7 shows high power operation and FIG. 8 shows low power operation.

In the alternative, the power amplifier 28 may be switched out of the output circuit by shutting off the drain/collector voltage of the amplifier or by applying cut-off bias to the gates or bases of the power amplifier transistors. The output of the driver amplifier 14 would thus be switched directly to the antenna, with a matching network added as necessary to compensate for any non-compatible antenna impedance.

The method and apparatus of the present invention can be implemented to improve the overall efficiency of transmission in dual-mode digital radio telephones. An example of such an implementation is shown in the preferred embodiment of FIGS. 9 and 10, wherein a pair of output stages 420 and 422 is provided to accommodate both linear and saturated operation of the system 410.

Figure 9:
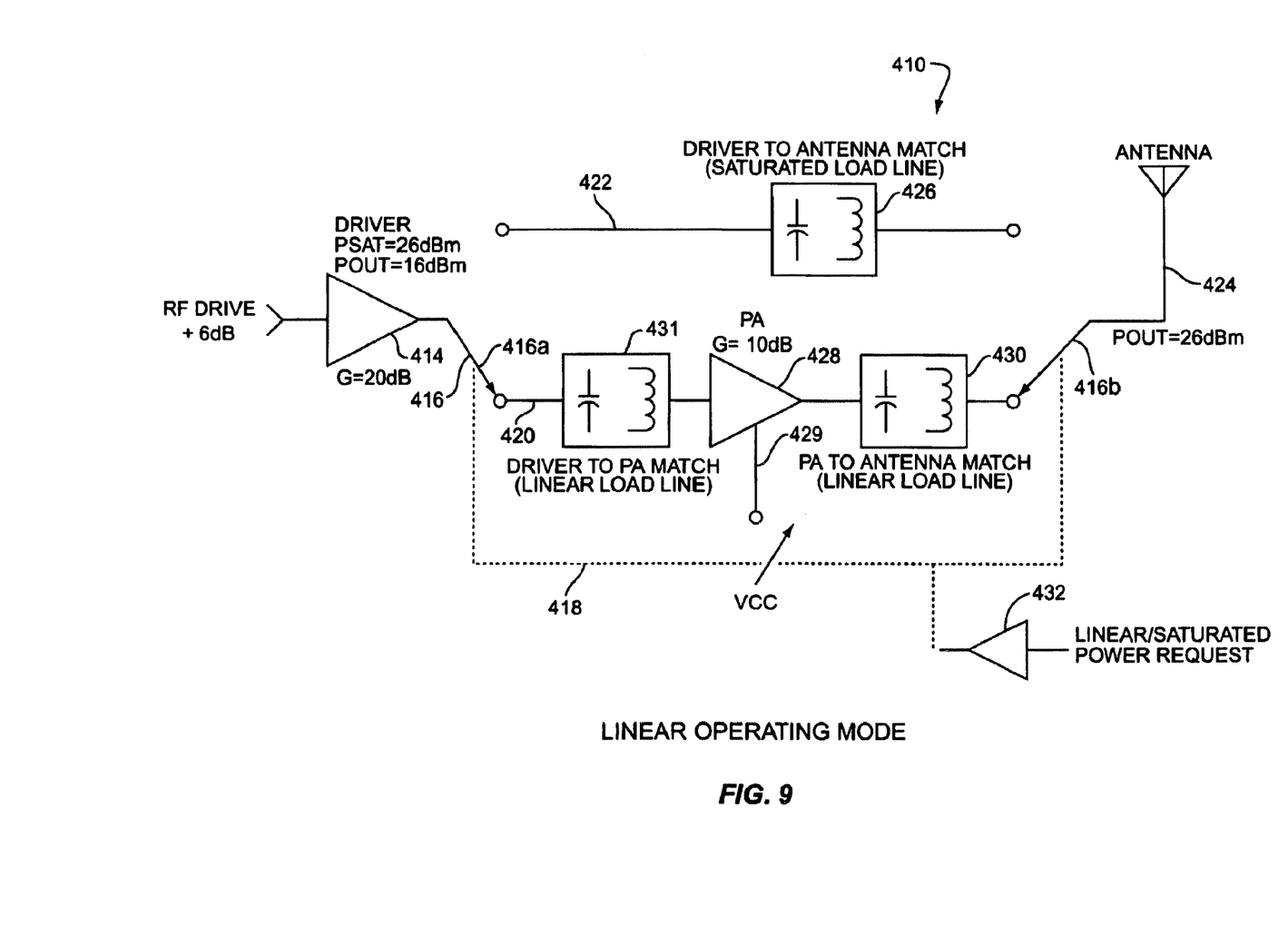
FIG. 9 is a schematic diagram of a fifth preferred embodiment of the apparatus embodying the present invention in a high power operating mode.

FIG. 9 shows the system 410 in a linear operating mode. The dual mode driver amplifier 414 is biased for saturated power, but the output power may be decreased in order to provide a linear output. Switching means 416 sends the driver output through an optional matching network 431 in order to match the output with the power amplifier 428. The power amplifier 428 is biased at 429 for linear output through a second matching network 430, throw means 416b and to antenna 424. Since both the driver 414 and load lines in output stage 420 are set for linear operation, efficient amplifier operation is achieved.

Figure 10:
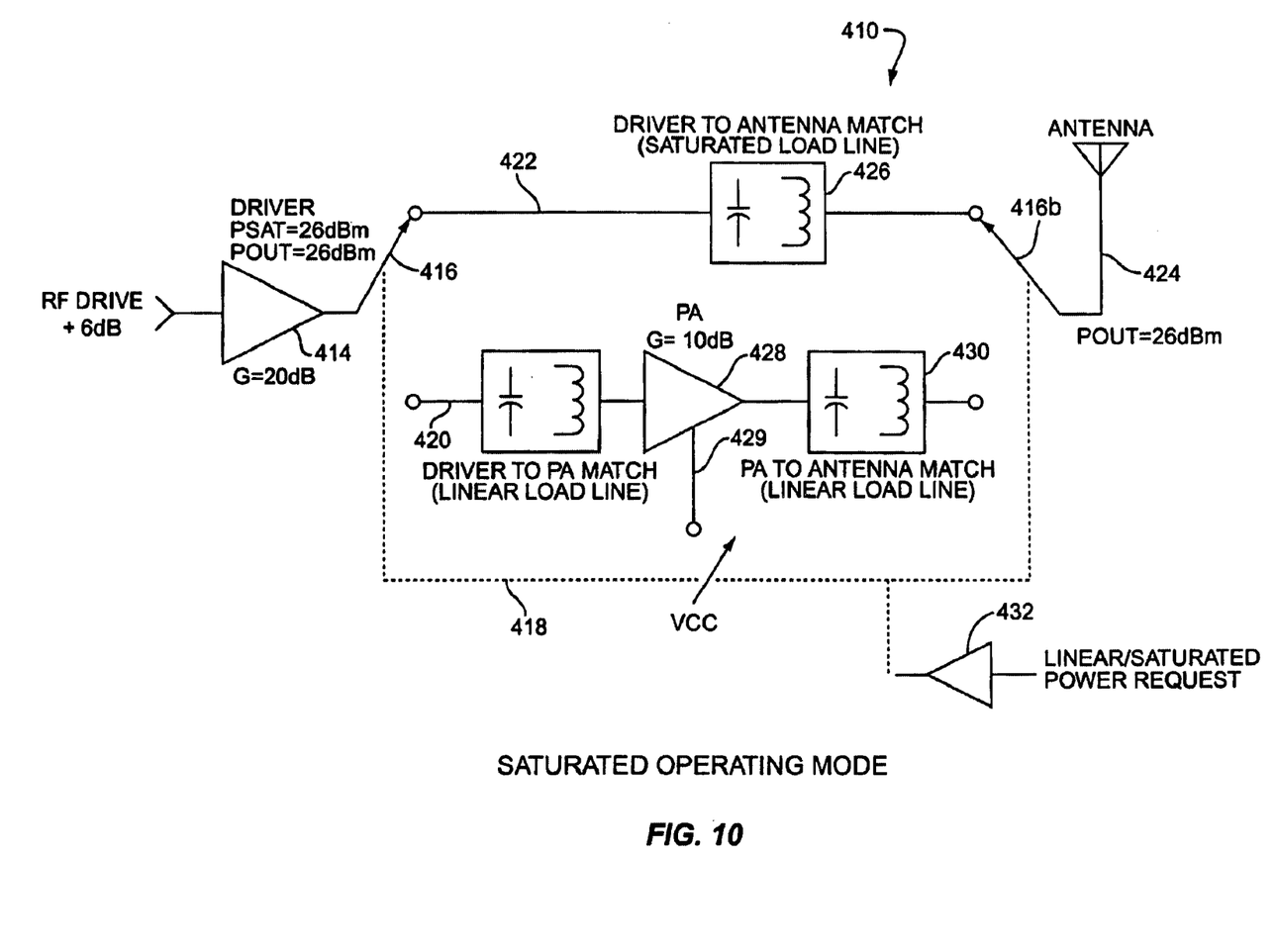
FIG. 10 is a schematic diagram of a fifth preferred embodiment as shown in FIG. 9 in a low power operating mode.

FIG. 10 shows the system 410 in a saturated operating mode. To switch to this mode, switching means 416 operates upon triggering by the request means 432, which determines whether the incoming drive signal is an analog or digital-modulated signal. When running in saturated mode, the driver 414 is now driven to a saturation point. The matching network 426 on the load line output stage 422 is connected with the driver 414 and the driver 414 operates as the power amplifier to excite the antenna 424. The switching means 416 also removes bias from the power amplifier 428, which is now off line, to save power. In this configuration, high efficiency of the driver is achieved because the driver is presented with a properly matched load line 422 for saturated power operation. In the alternative, the bias of the driver 414 could be adjusted between the linear and saturated modes.

Of course, it should be understood that a wide range of changes and modifications can be made to the embodiments described above. It is therefore intended that the foregoing detailed description be regarded as illustrative rather than limiting and that it be understood that it is the following claims, including all equivalents, which are intended to define the scope of this invention.

What is claimed is:

1. An apparatus for providing a radio frequency output from a radio frequency drive to an antenna, said apparatus comprising:

a first circuit path comprising an input connectable to said radio frequency drive, an output connectable to said antenna, and a driver amplifier having a first bias lead;

a second circuit path comprising an input connected to said radio frequency drive, an output connectable to said antenna, a second driver amplifier having a second bias lead, and a power amplifier having a third bias lead; and a switch device having:

a first state wherein the output of the first circuit path is connected to the antenna to provide a radio frequency output thereto, the output of the second circuit path is disconnected from the antenna, a bias is connected to the first bias lead, and the second and third bias leads are disconnected from a bias, and a second state wherein the output of the second circuit path is connected to the antenna to provide a radio frequency output thereto, the second and third bias leads are connected to a bias, and the fist bias lead is disconnected from a bias.

2. The apparatus, as set forth in claim 1, wherein said first circuit path further comprises a first matching network.

3. The apparatus, as set forth in claim 1, wherein said second circuit path further comprises a second matching network.

4. The apparatus, as set forth in claim 1, wherein said first circuit path further comprises a first matching network and wherein said second circuit path further comprises a second matching network.

5. The apparatus, as set forth in claim 1, further comprising an RF detector.

6. The apparatus, as set forth inc claim 1, further comprising a hysteresis circuit in communication with said RF detector for controlling operation of said switching device.

* * * * *